United States Patent
Su et al.

(10) Patent No.: US 8,751,975 B2
(45) Date of Patent: Jun. 10, 2014

(54) RC CORNER SOLUTIONS FOR DOUBLE PATTERNING TECHNOLOGY

(75) Inventors: Ke-Ying Su, Taipei (TW); Hsiao-Shu Chao, Baoshan Township (TW); Yi-Kan Cheng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/479,076

(22) Filed: May 23, 2012

(65) Prior Publication Data

US 2013/0275927 A1    Oct. 17, 2013

Related U.S. Application Data

(60) Provisional application No. 61/623,939, filed on Apr. 13, 2012.

(51) Int. Cl.
G06F 17/50    (2006.01)

(52) U.S. Cl.
USPC ............... 716/53; 716/50; 716/51; 716/54; 716/55; 716/56; 430/5; 430/30

(58) Field of Classification Search
USPC ............... 716/50–56, 106–115; 430/5, 30
See application file for complete search history.

(56) References Cited

U.S. PATENT DOCUMENTS 8,448,120 B2 * 5/2013 Huang et al. .................. 716/126
2012/0054696 A1 * 3/2012 Su et al. ........................ 716/55

OTHER PUBLICATIONS

"Assessing Chip-Level Impact of Double Patterning Lithograohy", by Kwangok Jeong, Andrew B. Kahng, and Ransit O. Topaloglu, IEE @2010.*

* cited by examiner

*Primary Examiner* — Nha Nguyen
(74) *Attorney, Agent, or Firm* — Slater and Matsil, L.L.P.

(57) ABSTRACT

A method includes determining model parameters for forming an integrated circuit, and generating a techfile using the model parameters. The techfile includes at least two of a C_worst table, a C_best table, and a C_nominal table. The C_worst table stores greatest parasitic capacitances between layout patterns of the integrated circuit when lithography masks comprising the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other. The techfile is embodied on a tangible non-transitory storage medium.

13 Claims, 14 Drawing Sheets

|  | S1 | S2 | S3 | S4 |
|---|---|---|---|---|
| W1 | k11_worst | k12_worst | k13_worst | k14_worst |
| W2 | k21_worst | k22_worst | k23_worst | k24_worst |
| W3 | k31_worst | k32_worst | k33_worst | k34_worst |

Fig. 3A

|    | S1        | S2        | S3        | S4        |
|----|-----------|-----------|-----------|-----------|
| W1 | k11_best  | k12_best  | k13_best  | k14_best  |
| W2 | k21_best  | k22_best  | k23_best  | k24_best  |
| W3 | k31_best  | k32_best  | k33_best  | k34_best  |

Fig. 3B

| | S1' | S2' | S3' | S4' | S5' |
|---|---|---|---|---|---|
| W1' | C11_worst | C12_worst | C13_worst | C14_worst | C15_worst |
| W2' | C21_worst | C22_worst | C23_worst | C24_worst | C25_worst |
| W3' | C31_worst | C32_worst | C33_worst | C34_worst | C35_worst |
| W4' | C41_worst | C42_worst | C43_worst | C44_worst | C45_worst |

Fig. 4A

|     | S1' | S2' | S3' | S4' | S5' |
| --- | --- | --- | --- | --- | --- |
| W1' | C11_best | C12_best | C13_best | C14_best | C15_best |
| W2' | C21_best | C22_best | C23_best | C24_best | C25_best |
| W3' | C31_best | C32_best | C33_best | C34_best | C35_best |
| W4' | C41_best | C42_best | C43_best | C44_best | C45_best |

Fig. 4B

|  | S1' | S2' | S3' | S4' | S5' |
|---|---|---|---|---|---|
| W1' | C11_nominal | C12_nominal | C13_nominal | C14_nominal | C15_nominal |
| W2' | C21_nominal | C22_nominal | C23_nominal | C24_nominal | C25_nominal |
| W3' | C31_nominal | C32_nominal | C33_nominal | C34_nominal | C35_nominal |
| W4' | C41_nominal | C42_nominal | C43_nominal | C44_nominal | C45_nominal |

Fig. 4C ated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

RC CORNER SOLUTIONS FOR DOUBLE PATTERNING TECHNOLOGY

This application claims the benefit of U.S. Provisional Patent Application No. 61/623,939, filed on Apr. 13, 2012, and entitled "RC Corner Solutions for Double Patterning Technology," which application is incorporated herein by reference.

BACKGROUND

Double patterning is a technology developed for lithography to enhance the feature density. Typically, for forming features of integrated circuits on wafers, the lithography technology is used, which involves applying a photo resist, and defining patterns on the photo resist. The patterns in the patterned photo resist are first defined in a lithography mask, which may be a glass with transparent patterns and opaque portions formed thereon. The transparent patterns of the lithography mask allow the light for exposing the photo resist to pass, and the opaque patterns blocks the light. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A and 3B illustrate a k_worst and a k_best table, respectively;

FIGS. 4A, 4B, and 4C illustrate a C_worst, a C_best, and a C_nominal table, respectively;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of determining parasitic capacitances and generating netlists for different process corners is provided in accordance with various exemplary embodiments. The variations of the embodiments are discussed. Throughout the various views and illustrative embodiments, like reference numbers are used to designate like elements. Throughout the description, although metal lines are used as examples to describe the concept of the embodiments, the embodiments may be applied on all conductive features such as polysilicon features in integrated circuits.

Figure 1:
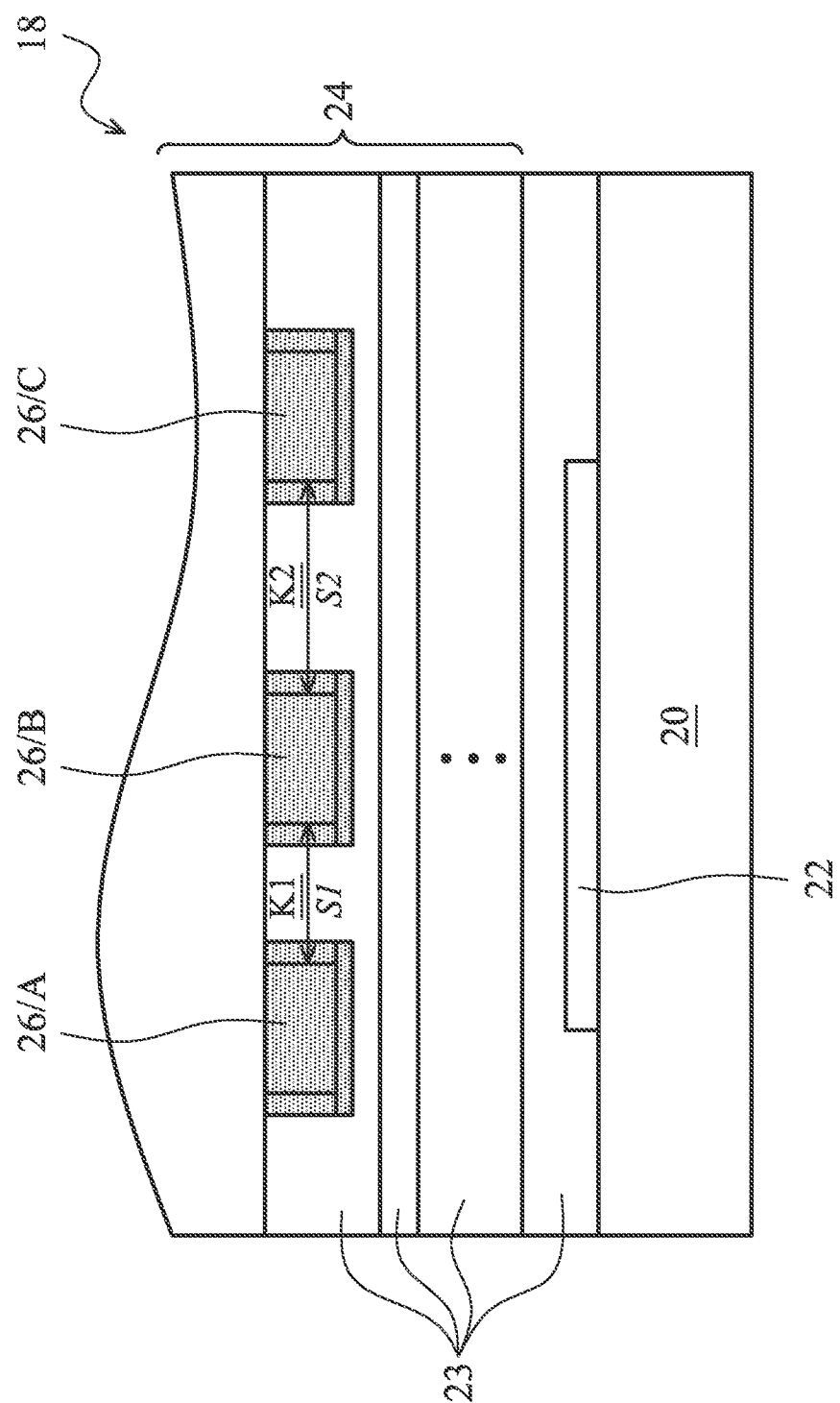
FIG. 1 illustrates a cross sectional view of a semiconductor chip, which is formed using double patterning technology.

FIG. 1 schematically illustrates semiconductor chip 18. Chip 18 includes substrate 20, which may be a semiconductor substrate such as a silicon substrate. Integrated circuit 22 is formed at a surface of substrate 20, wherein integrated circuit 22 includes transistors, resistors, capacitors, inductors, or the like. Interconnect structure 24 is formed over, and electrically coupled to, integrated circuit 22. Interconnect structure 24 includes a plurality of dielectric layers 23, and metal lines 26 and vias (not shown) in the dielectric layers 23.

In the illustrated example, metal lines 26, which are also marked as A, B, and C to distinguish from each other, have parasitic capacitance formed with each other. Assuming that the patterns of metal lines A and C are in a first lithography mask of a double patterning mask set, and the patter of metal line B is in a second lithography mask of the double patterning mask set, when the second lithography mask shifts to left relative to the first lithography mask, the distances S1 reduces, and distance S2 increases. The reduction in distance S1 results in the increase in the parasitic capacitance between metal lines A and B, and the increase in distance S2 results in the reduction in the parasitic capacitance between metal lines B and C. In the embodiments, the change due to the shift of lithograph masks is treated as the change caused by the dielectric constant (k value) of the dielectric material between metal lines A and B and between metal lines B and C, although the k value of the dielectric materials in reality does not change when the second lithography mask shifts relative to the first lithography mask. Furthermore, in accordance with embodiments, when k values are assumed to be changed for example, with k1 greater than k2, it is assumed that the spacings S1 and S2 between metal lines A, B and C remain unchanged, and are equal to the designed values. Alternatively stated, in accordance embodiments, equivalent k-value changes are used to represent the effect caused by the shift of lithography masks, and with the equivalent k-value changes, it is assumed that the lithography masks do not shift.

When the lithography masks shift, the parasitic capacitance of a metal line with all other metal features may increase or decrease, depending the direction of the shift, the magnitude of the shift, and various other factors. In the manufacturing of the integrated circuits, the direction and the magnitude of the mask shift cannot be controlled. However, the maximum shift that may occur to a specific circuit manufacturing can be determined, for example, according to the previous manufacturing experience. Within the limit of the maximum magnitude of the mask shift, the lithography mask shift may have any magnitude and in any direction. The parasitic capacitance also changes in response to the mask shift. When the magnitudes and the directions of the mask shift change, a metal line (such as metal line B) will have a biggest parasitic capacitance value with other conductive feature, which capacitance is also referred to the worst capacitance (C_worst) throughout the description. There will also be a smallest capacitance value, which is referred to the best capacitance (C_best). The C_best value is smaller than the C_worst value. Furthermore, there is also a nominal parasitic capacitance (C_nominal) for each of the metal lines in a circuit, which is the parasitic capacitance when there is no mask shift occurs. Accordingly, there exists the relationship C_best<=C_nominal<=C_worst. Throughout the description, each of the C_worst, C_best, and C_nominal is referred to as corresponding to a process corner, namely, the worst, the best, and the nominal process corners.

Figure 2:
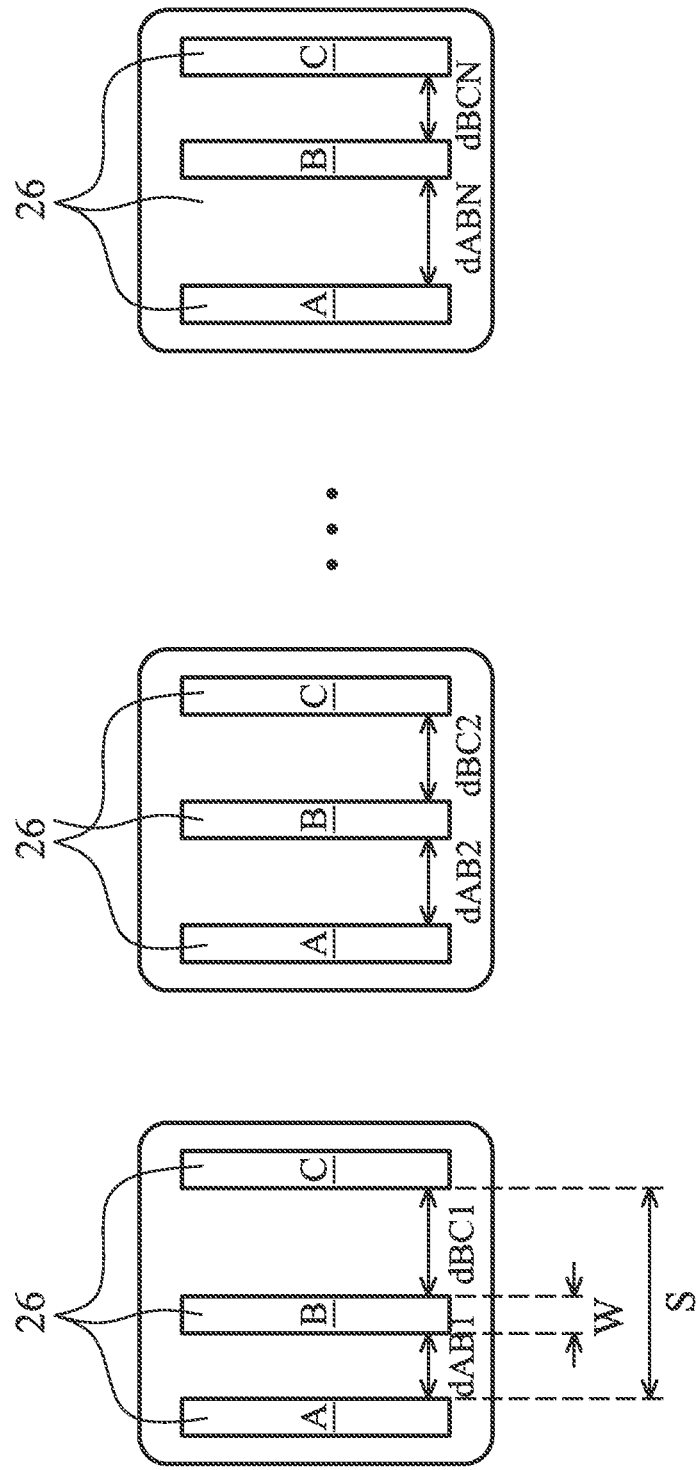
FIG. 2 illustrates metal lines have different spacings, wherein a simulation is performed to calculate a worst capacitance value and a best capacitance value.

FIG. 2 illustrates how capacitance values C_worst and C_best are calculated through simulation. The simulated metal lines 26 include A, B, and C, which are parallel to each other. Metal line B is between metal lines A and C. Metal lines A and C are on a first lithography mask, and metal line B is on a second lithography mask, wherein the first and the second lithography masks form a double patterning mask set. The first and the second lithography masks include opaque patterns for blocking light, and transparent patterns for allowing the light to pass through. The distance S between metal lines A and C remains constant due to the fact that metal lines A and C are on the same mask. Metal line B shifts relative to metal lines A and C due to the mask shift. The direction and the magnitude of the shift affect the distance between metal lines A and B and between metal lines B and C, and the change in the direction and the magnitude of the shift results in the change in the parasitic capacitance between metal lines A and B and the parasitic capacitance between metal lines B and C.

FIG. 2 illustrates a plurality of simulation samples, wherein the magnitudes and the directions of different samples are different from each other. The distances dAB (including dAB1, dAB2 ... dABN) are different from each other, and distances dBC (including dBC1, dBC2 ... dBCN) are different from each other. Distances dAB and dBC are selected so that the magnitude of the shift is smaller than or equal to the maximum magnitude, which is pre-determined, for example, from manufacturing experience. For each of the samples, the total parasitic capacitance of metal line B, which is the sum of the parasitic capacitance between metal lines A and B and the parasitic capacitance between metal lines B and C, is calculated. The worst capacitance C_worst and best capacitance C_best are found from the plurality of coupling parasitic capacitance of metal line B. The C_worst value is the greater coupling parasitic capacitance of metal line B in all samples, and the C_best value is the smallest coupling parasitic capacitance of metal line B in all samples.

As aforementioned, the change in the parasitic capacitance due to the change in spacing between metal lines is equivalent to if the spacing is not changed, while the k value of the dielectric material between the metal lines is changed. Accordingly, C_worst and C_best are converted to a worst k value (k_worst) and a best k value (k_best), respectively. The conversion may be performed using equation:

$$k=(CS)/(\in oA) \qquad \text{[Eq. 1]}$$

Wherein k is the dielectric constant, C is the capacitance (C_worst or C_best), S is the spacing, and $\in o$ is the electric constant, and A is the overlap area between the metal lines.

Both the spacing (such as dAB or dBC) between a metal line (such as metal line B) and its neighboring metal lines (such as A and C) and the width W of metal line B affect the resulting C_worst and C_best values, and hence affect the equivalent k_worst and k_best values, A plurality of calculations/simulation may be performed for a plurality of metal lines, each having a plurality of spacings, a plurality of widths, and a plurality of thicknesses. In each of the calculations/simulations, a k_worst and a k_best value are obtained. The results are used to form a table for storing k_worst values, which table is referred to as a k_worst table. An exemplary k_worst table is shown in FIG. 3A, wherein the width W (such as W1 through W3) of metal line B is placed as the column index, and the spacing (such as S1 through S4) between metal line B and its neighboring metal lines is placed as the row index. The table cell values are k_worst values. Similarly, a table is formed for best k value k_best, which table is referred to as a k_best table. An exemplary k_best table is shown in FIG. 3B. Furthermore, if there is no shift between the masks in the double patterning mask set, the k value between metal line B and metal line A, and the k value between metal line B and metal line C will be equal to a nominal value k_nominal, which is the k value of the dielectric material that will be used in the manufacturing process.

The k_worst table and the k_best table are then used to construe a C_worst table and a C_worst table, as shown in FIGS. 4A and 4B, respectively. A "'" sign appended to each of the spacings S1 through S5 and each of the widths W1 through W4 to indicate that they may not have a one-to-one correspondence with the column and the row index of the k_worst table and the k_best table. The C_worst table is constructed by using the k_worst values in the k_worst table, and using the following equation as a reference (with additional factors considered):

$$C=\in ok(A/S) \qquad \text{[Eq. 2]}$$

Wherein k is the dielectric constant (k_worst or k_best, depending on whether C is the C_worst or the C_best) that is found from the k_worst or the k_best table, C is the capacitance C_worst or C_best, S is the spacing, $\in o$ is the electric constant, and A is the overlap area of the respective metal lines.

It is appreciated that converting C_worst and the C_best values obtained from FIG. 2 to the k_worst and k_best values, and then converting the k_worst and k_best values back to C_worst and the C_best values seems to be forming a loop. In reality, the total number of simulated patterns such as features 26 (A, B, and C) is limited. When calculating the C_worst and the C_best values from the k_worst and k_best, a greater number of patterns, for example, with different shapes, different sizes, and so on, may be calculated. For example, FIG. 2 illustrates metals 26 as being metal strips, and through the calculation, the C_worst and the C_best may be calculated for other shapes such as hexagons. Furthermore, other factors that affect the capacitances, such as width W of metal line B, are also be considered so that the calculated C_worst and the C_best are more accurate.

FIG. 4C further illustrates a C_nominal table, wherein the nominal parasitic capacitances between metal lines are calculated using equation 2 as a reference, and the k value in Equation 2 is k_nominal.

Tables 4A, 4B, and 4C are referred to as a three-in-one capacitance table, and the content in tables 4A, 4B, and 4C may be incorporated into a techfile (which may include a plurality of techfile). The techfile may have any format including tables, lists, or the like. In the techfile, each net, which is a piece of conductive feature such as a piece of metal line, is associated with three capacitance values, namely C_worst, C_best, and C_nominal. The respective techfile is accordingly referred to as a three-in-one techfile. Since different metal layers may have different metal thicknesses, a three-in-one capacitance table and a three-in-one techfile may be formed for each of the metal layers. The three-in-one techfile may then be used to construct netlists for designed integrated circuits.

Figure 5:
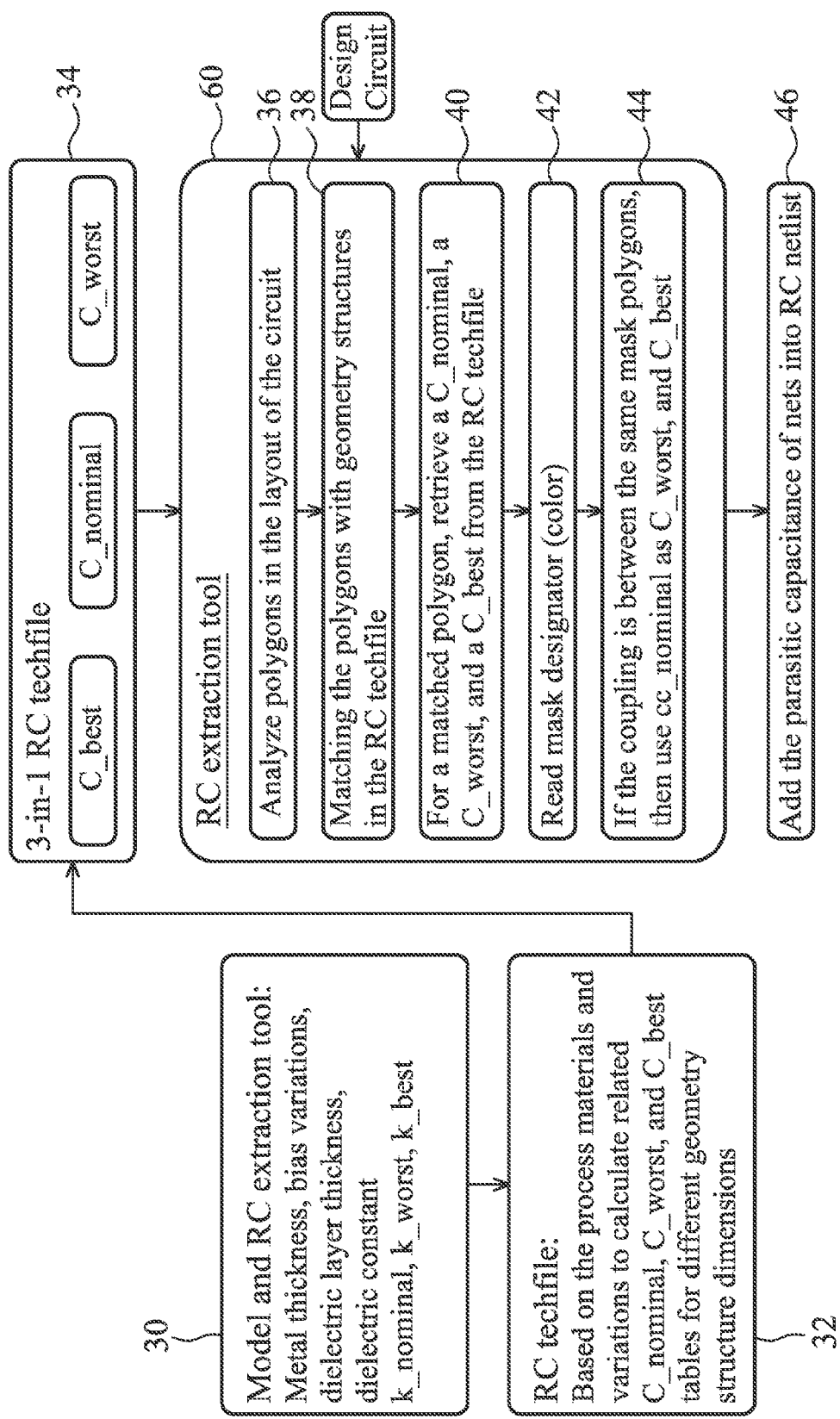
FIG. 5 illustrates a flow chart of generating RC netlists for a circuit design in accordance with some embodiments.

FIG. 5 illustrates a flow chart for constructing netlists for an integrated circuit design. Referring to step 30. A model and a respective RC extraction tool are selected. Along with the model, the technology node that is used to form the integrated circuit is determined. Furthermore, the process parameters associated with the model and the forming technology is determined, which process parameters include metal thicknesses (for example, in FIG. 1), bias variations, dielectric layer thicknesses for each of the dielectric layers, nominal dielectric constant k_nominal for each of the dielectric layers. Based on these values, the k_worst and the k_best tables (FIGS. 3A and 3B) are also calculated using the method related to FIG. 2. Next, in step 32, the three-in-one techfile (which may be the three-in-one capacitance table) is constructed, wherein the three-in-one techfile is illustrated in block 34 (FIGS. 4A through 4C).

The design of an integrated circuit is provided, and the layout is extracted through an analysis step (step 36) to obtain the polygons of the features (such as metal features) in the layout. Next, in step 38, the polygons in the layout may be partitioned into smaller pieces, with each of the pieces referred to a net throughout the description. For example, a long metal line may be partitioned into a plurality of short metal lines, which are nets. Referring to step 40, each of the nets is matched to or interpolated from the stored items the three-in-one techfile, for example, by using the geometry structure (such as the width and the spacing of the nets as indexes to index to the C_worst, C_best, and C_nominal tables. For example, the thickness of the net, the width W of the net, and the spacing between the net and the neighboring features are used as the row index or column index. As a result, for each of the nets, three capacitance values C_worst, C_best, and C_nominal are retrieved, and a netlist for the net is generated to store the retrieved C_worst, C_best, and C_nominal values. By traversing through the partitioned nets of a polygon, the netlists of the entire polygon are obtained. Furthermore, by traversing through the polygons of the entire layout, the netlists of the entire layout may be obtained, and written as the netlists of the integrated circuit.

Figure 7A:
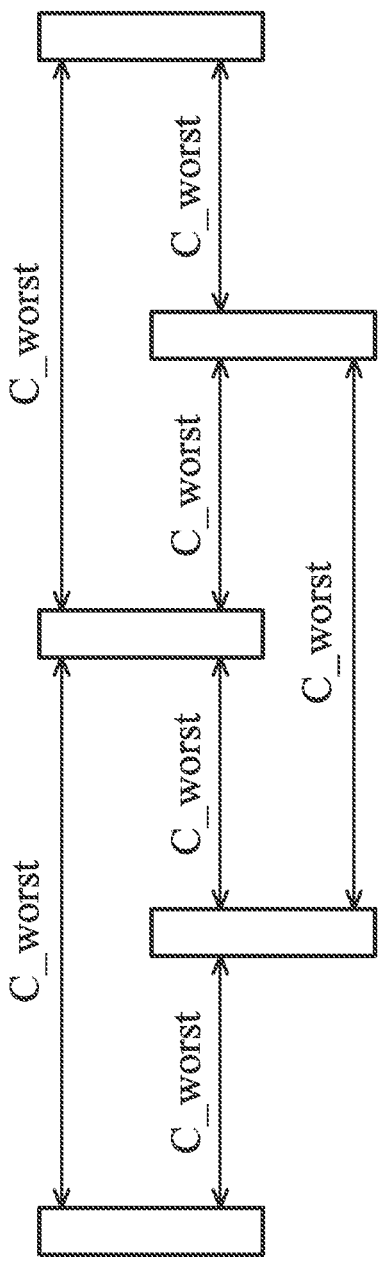
FIG. 7A illustrates the parasitic capacitance values to be retrieved for the worst process corner when no mask designators are applied on nets.

Step 42 is a step for optimizing the netlists. When two nets are assigned to a same lithography mask of a double patterning mask set, the distance there between remains the same regardless how the masks in the double patterning mask set shift relative to each other. Accordingly, the spacing between these two nets is the same as designed, and the parasitic capacitance between them is the nominal capacitance C_nominal. Accordingly, for all the nets on the same lithography mask, their capacitance formed there between should be found from the C_nominal table (and/or the respective portion of the three-in-one techfile). In the respective netlists for these nets, the respective C_worst and C_best therebetween are also equal to the respective C_nominal. FIG. 7A illustrates a portion of an exemplary layout. It has not been determined how to assign the illustrated nets to masks. Accordingly, it is assumed that each of the illustrated nets is on a different mask than other illustrated nets. When writing into a netlist, the C_worst values of the illustrated nets will be retrieved from the C_worst table.

Figure 7B:
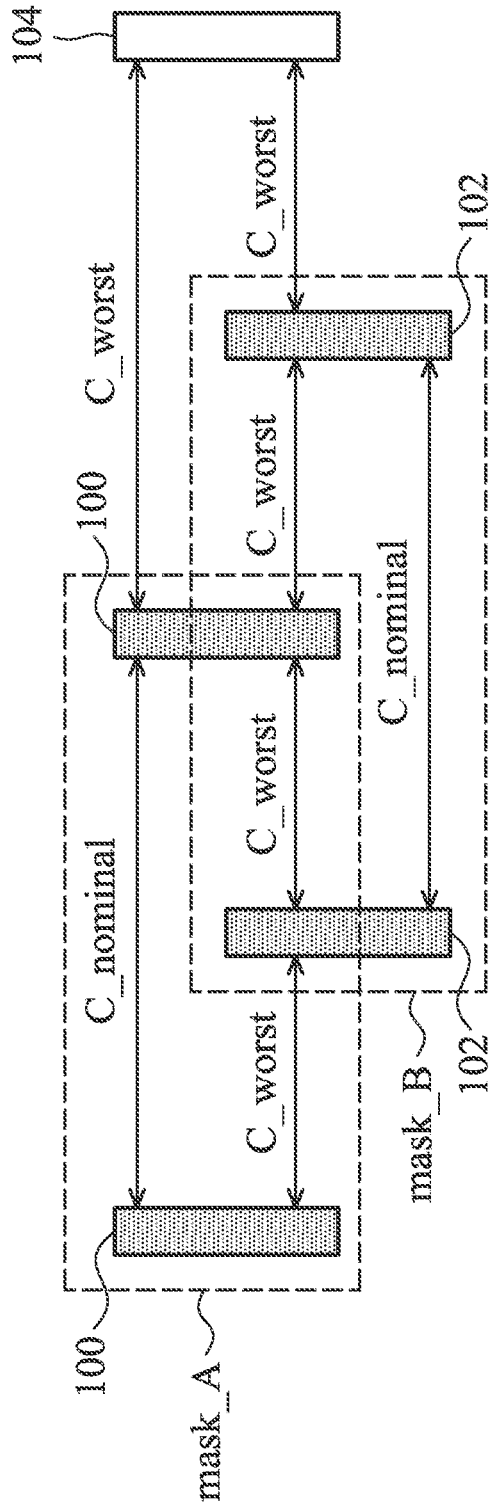
FIG. 7B illustrates the parasitic capacitance values to be retrieved for the worst process corner when mask designators are applied on nets, wherein the capacitance between the nets on the same mask are retrieved from the C_nominal table.

Referring to FIG. 7B, the nets as shown in FIG. 7A are decomposed (assigned) into two masks, wherein nets 100 are in mask_A, and nets 102 are in mask_B. It has not been determined which mask net 104 is to be assigned to. At the layout design stage (before step 36), nets 100 and 102 are marked with a first color and a second color, respectively, indicating that they are placed on masks mask_A and mask_B, respectively. Net 104 is not colored. In accordance with embodiments, the colors of the nets are used to determine whether the respective C_worst and C_best values should be replaced with C_nominal values. The colors are also referred to as mask designators, which designate the corresponding masks that are associated with nets. It is appreciated that other mask designators such as numbers, letters, or the like, may also be used as mask designators.

Figure 6:
FIG. 6 illustrates a portion of a RC netlist file generated using the process flow in FIG. 5.

Referring back to FIG. 5, in step 42, the colors of the nets are read from the layout. For example, nets 100 in FIG. 7B have the same color, nets 102 have the same color, and net 104 is uncolored. Since the colors indicate that nets 100 have the same color, the C_worst and C_best values between nets 100 are replaced with the C_nominal value (step 44), the C_worst and C_best values between nets 102 are replaced with the C_nominal value (step 44), while the C_worst and C_best values between a metal line 100 and a net 102 remain unchanged. FIG. 6 illustrates a file comprising a portion of the resulting netlists. Net2 represents one of the respective nets, wherein the C_worst and C_best values of Net2 are equal to the respective C_nominal. The un-colored net 104 is treated as being placed on different masks than both mask_A and mask_B. Accordingly, the C_worst and C_best values between net 104 and nets 100 remain un-replaced, and the C_worst and C_best values between net 104 and nets 102 remain un-replaced. A respective netlist is represented as net1 in FIG. 6. With the C_worst and C_best values replaced with the respective C_nominal, the netlists more accurately reflect the effect of the double patterning technology, and the resulting performance simulation is more accurate.

The constructed netlists, which include the C_worst, C_best, and C_nominal values, are then written into netlists (step 46 in FIG. 5), as shown in FIG. 6. FIG. 6 illustrates a portion of an exemplary netlist file 49, which includes the netlists for nets Net1, Net2, Net3, and so on. Net2 is obtained due to step 42 in FIG. 5. Each of the nets is associated with a C_worst, a C_best, and a C_nominal value. Accordingly, designers may take these values, and run performance simulations for the integrate circuit. Since the C_worst, the C_best, and the C_nominal values are provided, the best performance (such as the best timing), the worst performance, and the nominal performance, which are associated with C_worst values, C_best values, and C_nominal values, respectively, may be simulated using the netlists.

The process flow in FIG. 5 may be used when the respective simulator for simulating the performance of the integrated circuit is configured to recognize the format of multi-valued capacitance values. If the format used by the simulator does not support the multi-valued capacitance values, the flow chart in FIG. 8 may be used. In the netlists constructed using the flow in FIG. 8, each of the nets is related to one, instead of three, of the C_worst, C_best, and C_nominal. Different nets, however, may be obtained from different ones of the C_worst, C_best, and C_nominal tables.

Figure 8:
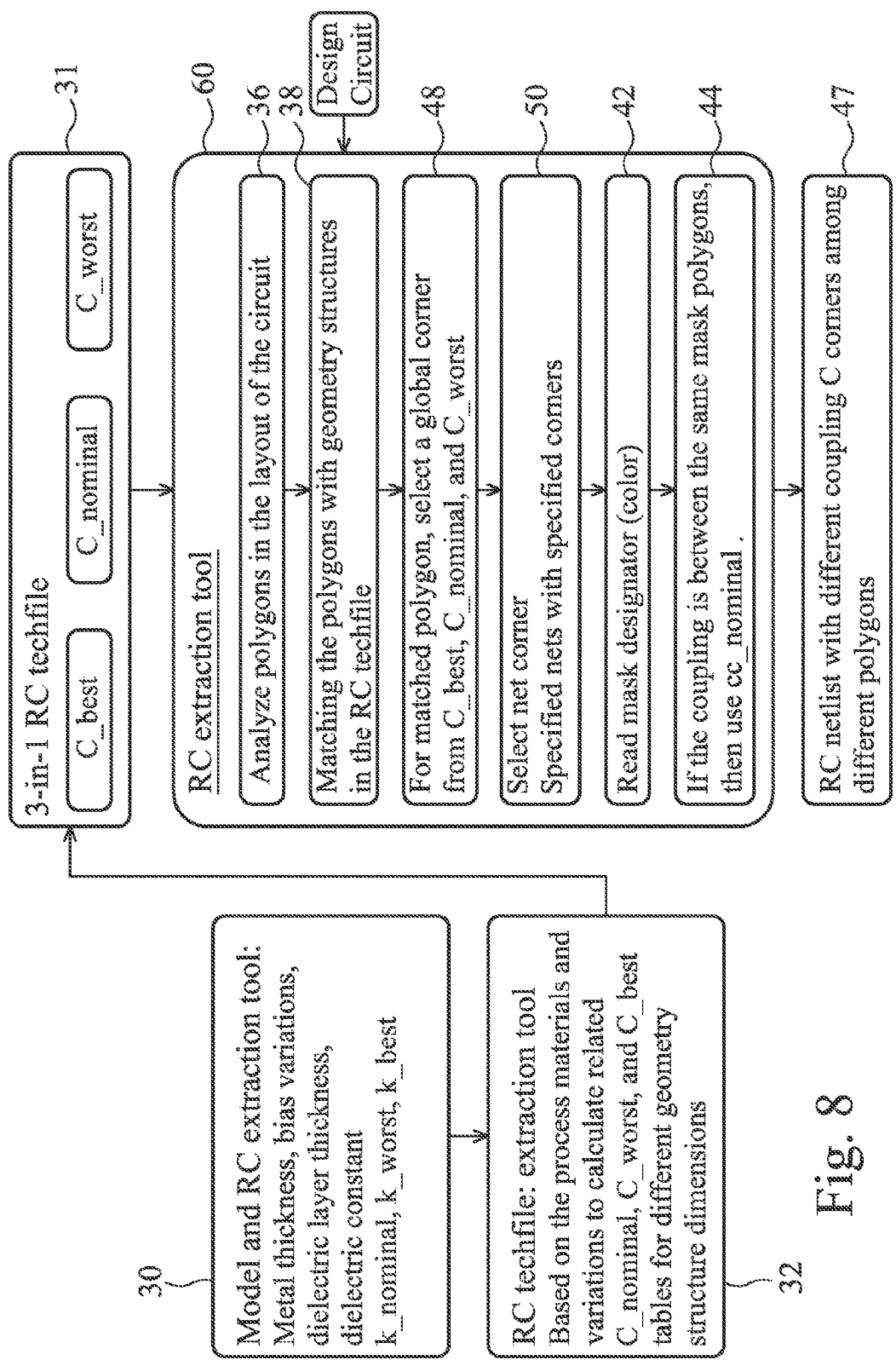
FIG. 8 illustrates a flow chart of generating RC netlists for a circuit design in accordance with alternative embodiments.
Figure 9:
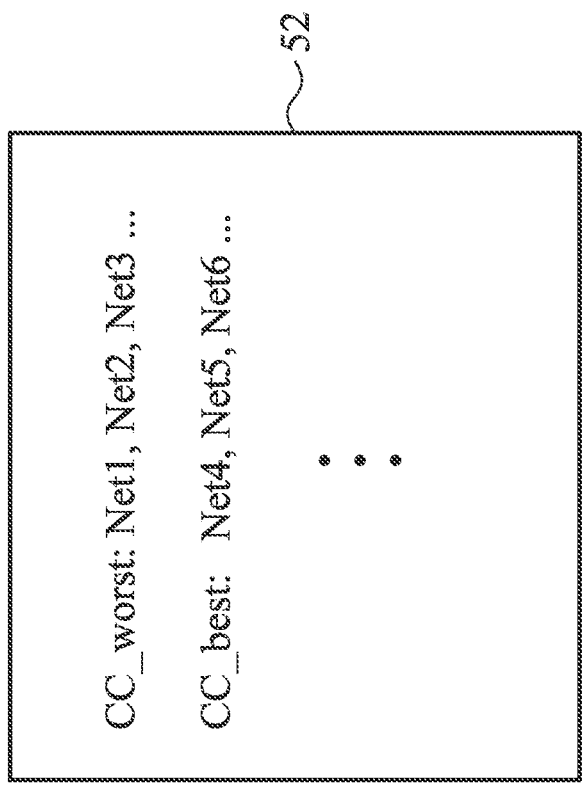
FIG. 9 illustrates an exemplary file used for specifying process corners for selected nets in the layout.

In FIG. 8, steps 30, 32, 34, 36, and 38 are the same as shown in FIG. 5, and the respective details are not repeated herein. In step 48, a global process corner is selected, which is the default process corner for all nets in the layout. In the following discussion, it is assumed that the selected global process corner is the nominal corner. Accordingly, in the step shown in FIG. 38, C_nominal values are retrieved from the three-in-one techfile for all nets in the layout and are by default written into the netlists. Next, in step 50, some of the designated nets may be changed from the global process corner to other process corners. For example, a file may be provided, in which the desirable process corners of some selected nets are specified. FIG. 9 schematically illustrates file 52, which is stored on a tangible non-transitory storage medium such as a hard disk. File 52 specifies that nets Net1, Net2, and Net3 should be at the worst process corner, and nets Net4, Net5, and Net6 should be at the best process corner. Accordingly, in step 48, the capacitance values of nets Net1, Net2, and Net3 are changed to the respective C_worst values retrieved from the C_worst table in the three-in-one techfile. The retrieved C_worst values replace the default C_nominal values for nets Net1, Net2, and Net3. Similarly, the capacitance values of nets Net4, Net5, and Net6 are changed to the respective C_best values retrieved from the C_best table in the three-in-one techfile. The retrieved C_best values replace the default C_nominal values for nets Net4, Net5, and Net6.

Figure 10:
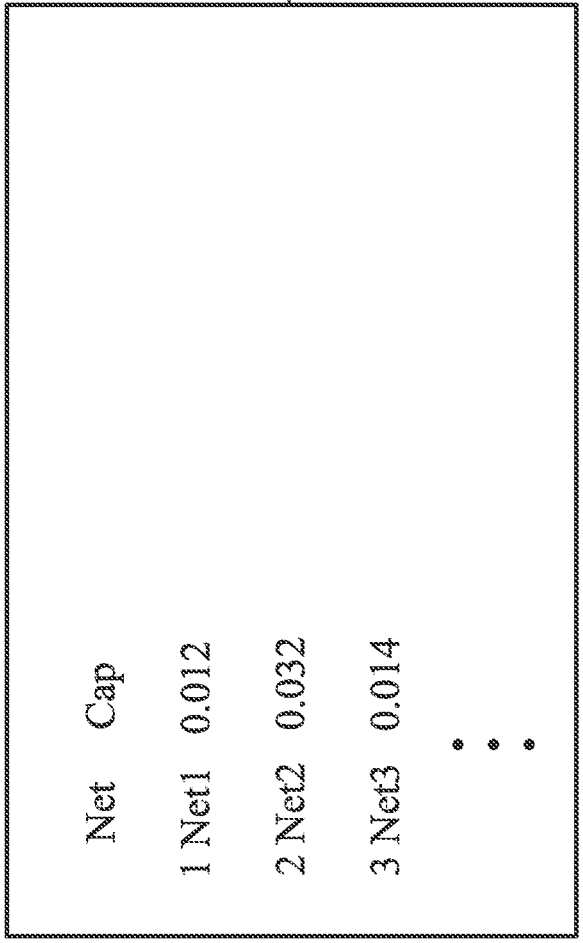
FIG. 10 illustrates a portion of a RC netlist file generated using the process flow in FIG. 8.

Next, in steps 42 and 44, the color information are read from the layout, and the capacitances between the nets that have the same color (on the same mask) are changed to the respective C_nominal values, assuming they were not C_nominal values before. The details of steps 42 and 44 are essentially the same as the steps 42 and 44 in FIG. 5. In step 47, the generated netlists are put into (RC) netlists. FIG. 10 schematically portions of the generated exemplary netlists, which are stored in file 51. File 51 may be stored on a tangible non-transitory storage medium.

Figure 11:
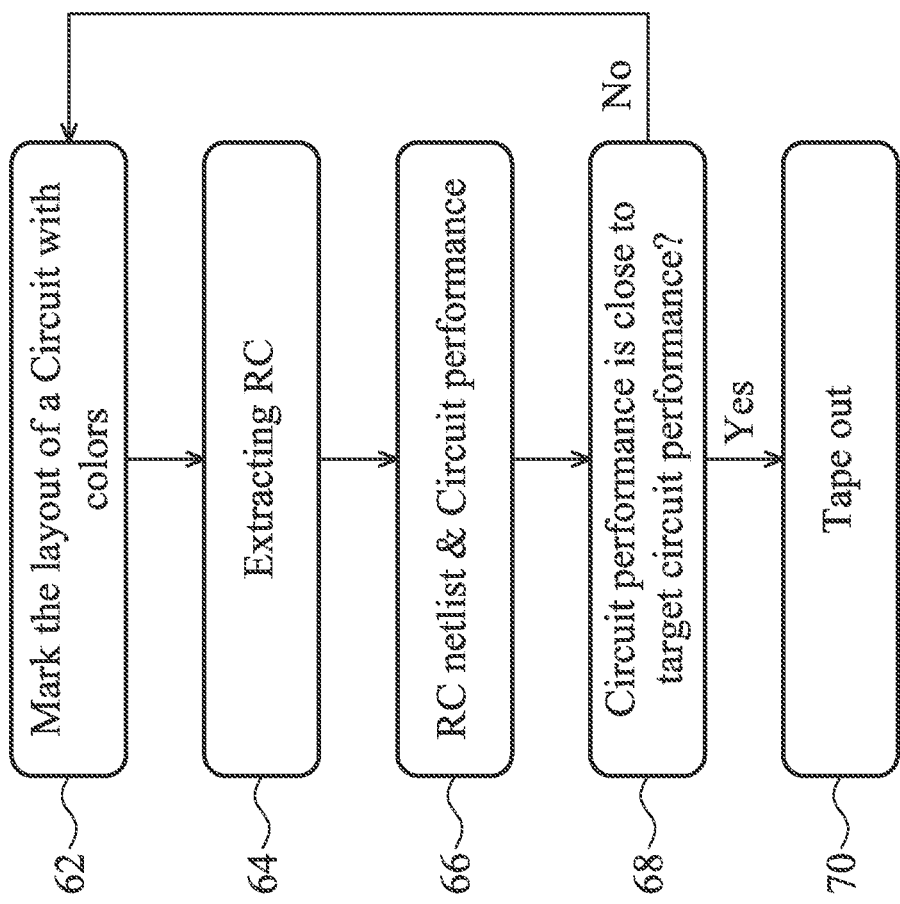
FIG. 11 illustrates an exemplary process flow for optimizing circuit design through the modification of mask designators.

FIG. 11 illustrates an exemplary process flow for optimizing circuit. Referring to step 62, a circuit is designed, and the layout is drawn. The layout is marked with colors (or other mask designators) to indicate which nets in the layout will be decomposed into which lithography masks of a double patterning mask set. Next, as represented by step 64, the steps shown in block 60 in either FIG. 5 or FIG. 8 are performed, and the respective RC netlists are extracted (step 66). During the extraction, steps 40 and 42 in FIGS. 5 and 8 are performed. Accordingly, the color information (the mask designator) affects the values in the netlists. Next, as also shown in step 66, the performance (such as the timing) of the circuit is simulated using the netlists. The simulated performance is compared to the target performance (step 68). If the simulated performance meets the target performance, the circuit can be taped out (step 70). Otherwise, the process flow loops back to step 62, wherein the layout is modified, with the colors of the nets changed. Steps 64, 66, and 68 are then performed on the updated layout to determine whether the performance of the circuit with the updated layout meets the target performance requirement. The loop continues until eventually, the target performance is met.

The process steps as in the embodiments may be performed by a computer(s), which includes software and hardware. The intermediate and final results of the embodiments may be saved on a tangible non-transitory computer-readable medium such as hard drives, discs, and the like. For example, the various values such as k_worst, k_best, the techfile as shown in FIGS. 4A, 4B, and 4C, the integrated circuit layout, and the generated netlists may be saved on the non-transitory computer-readable medium. In addition, the steps as shown in FIGS. 5 and 8 may also be executed by a computer, which embodies program codes for performing the steps. The program codes may also be saved on a tangible non-transitory computer-readable medium such as hard drives, discs, and the like. Furthermore, In FIGS. 5 and 8, the steps in block 60 is performed by a RC extraction tool, which includes computer hardware and programming code embodied on a tangible non-transitory storage medium, such as a hard disk.

In accordance with embodiments, a method includes determining model parameters for forming an integrated circuit, and generating a techfile using the model parameters. The techfile includes at least two of a C_worst table, a C_best table, and a C_nominal table. The C_worst table stores greatest parasitic capacitances between layout patterns of the integrated circuit when lithography masks comprising the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other. The techfile is embodied on a tangible non-transitory storage medium.

In accordance with other embodiments, a method includes analyzing polygons in a layout of an integrated circuit, wherein the layout is embodied on a tangible non-transitory computer-readable medium, partitioning the polygons into nets, and finding at least one parasitic capacitance of each of the nets from a techfile. The techfile includes at least two of a C_worst table, a C_best table, and a C_nominal table. The C_worst table stores greatest parasitic capacitances between layout patterns of the integrated circuit when lithography masks comprising the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other. During the step of finding, a width and a spacing of the each of the nets are used to index into at least one of the C_worst table, the C_best table, and the C_nominal table.

In accordance with yet other embodiments, a method includes analyzing polygons in a layout of an integrated circuit, wherein the layout is embodied on a tangible non-transitory computer-readable medium, partitioning the polygons into nets, and finding at least two of a worst capacitance, a best capacitance, and a nominal capacitance for each of the nets from a C_worst table, a C_best table, and a C_nominal table, respectively. The step of finding includes indexing into the C_worst table, the C_best table, and the C_nominal table using widths and spacings of the nets as indexes.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   determining model parameters for forming an integrated circuit; and
   generating a techfile using the model parameters, wherein the generating the techfile is performed using a computer, and wherein the techfile comprises at least two of a C_worst table, a C_best table, and a C_nominal table, and wherein:
      the C_worst table stores greatest parasitic capacitances between layout patterns of the integrated circuit when lithography masks comprising the layout patterns shift relative to each other;
      the C_best table stores smallest parasitic capacitances between the layout patterns when the lithography masks shift relative to each other; and
      the C_nominal table stores nominal parasitic capacitances between the layout patterns when the lithography masks do not shift relative to each other, wherein the techfile is embodied on a tangible non-transitory storage medium, wherein the step of generating the techfile comprises:
   determining a maximum shift of a first lithography mask relative to a second lithography mask, wherein the first and the second lithography masks are comprised in a double patterning mask set;
   selecting a shift magnitude smaller than the maximum shift, wherein the shift magnitude represents a shift of a first net in the first lithography mask relative to second nets in the second lithography mask;
   calculating coupling capacitance values between the first net and each of the second nets;
   calculating a total capacitance of the capacitance values;
   repeating the steps of selecting, calculating the coupling capacitance values, and calculating the total capacitance, wherein in each cycle of the repeating, an additional shift magnitude different from the shift magnitude is selected, and an additional total parasitic capacitance is calculated;
   selecting a greatest capacitance from the total parasitic capacitance and the additional total parasitic capacitance; and
   selecting a smallest capacitance from the total parasitic capacitance and the additional total parasitic capacitance; and
   converting the greatest capacitance and the smallest capacitance into an equivalent k_worst value and a k_best value, respectively, wherein the k_worst value represents a k value that causes a parasitic capacitance between the first net and one of the second nets to increase to the greatest capacitance when the first lithography mask shift relative to the second lithography mask, and wherein the k_best value represents a k value that causes a parasitic capacitance between the first net and one of the second nets to reduce to the smallest capacitance when the first lithography mask shift relative to the second lithography mask.

2. The method of claim 1 further comprising forming a k_worst table and a k_best table, wherein the k_worst table stores k_worst values of nets as a function of different spacings and different widths, and wherein the k_best table stores k_best values of the nets as a function of the different spacings and the different widths.

3. The method of claim 2 further comprising calculating the C_worst table and the C_best table from the k_worst table and the k_best table, respectively.

4. The method of claim 1 further comprising calculating the C_nominal table from a k_nominal value, wherein the k_nominal value is equal to a k value of a dielectric material between the layout patterns.

5. A method comprising:
   analyzing polygons in a layout of an integrated circuit, wherein the layout is embodied on a tangible non-transitory computer-readable medium;
   partitioning the polygons into nets, wherein the partitioning the polygons is performed using a computer;
   finding at least one parasitic capacitance of each of the nets from a techfile, wherein the techfile comprises at least two of a C_worst table, a C_best table, and a C_nominal table, and wherein:
      the C_worst table stores greatest parasitic capacitances between layout patterns of the integrated circuit when lithography masks comprising the layout patterns shift relative to each other;
      the C_best table stores smallest parasitic capacitances between the layout patterns when the lithography masks shift relative to each other; and
      the C_nominal table stores nominal parasitic capacitances between the layout patterns when the lithography masks do not shift relative to each other, wherein during the step of finding, a width and a spacing of the each of the nets are used to index into at least one of the C_worst table, the C_best table, and the C_nominal table, wherein finding the at least one parasitic capacitance comprises, for at least one of the each of the nets, finding a C_worst value form the C_worst table, finding a C_best value form the C_best table, and finding a C_nominal value form the C_nominal table;
   reading mask designators of the nets from the layout; and
   for portions of the nets (same-mask nets) that are marked with the same one of the mask designators, replacing parasitic capacitance values of the same-mask nets with nominal capacitances found from the C_nominal table.

6. The method of claim 5, wherein the step of finding at least one parasitic capacitance comprises, for each of the nets, finding a C_worst value from the C_worst table, finding a C_best value from the C_best table, and finding a C_nominal value from the C_nominal table.

7. The method of claim 5 further comprising:
   pre-determining a global process corner; and
   identifying one of the C_worst table, the C_best table, and the C_nominal table as a default table corresponding to the global process corner, wherein in the step of finding at least one parasitic capacitance of each of the nets from the techfile, the at least one parasitic capacitance is found from the default table.

8. The method of claim 7 further comprising, in response to a pre-marking of selected nets in the nets of the polygons as corresponding to a process corner different from the global process corner, finding capacitance values of the selected nets from one of the C_worst table, the C_best table, and the C_nominal table different from the default table.

9. The method of claim 5 further comprising writing the at least one parasitic capacitance of each of the nets into netlists, wherein the netlists are embodied on a tangible non-transitory computer-readable medium.

10. The method of claim 9 further comprising:
    retrieving the at least one parasitic capacitance from the netlists; and
    simulating a best performance, a nominal performance, and a worst performance of the integrated circuit.

11. A method comprising:
analyzing polygons in a layout of an integrated circuit, wherein the layout is embodied on a tangible non-transitory computer-readable medium, and wherein the analyzing the polygons is performed using a computer;
partitioning the polygons into nets;
finding at least two of a worst capacitance, a best capacitance, and a nominal capacitance for each of the nets from a C_worst table, a C_best table, and a C_nominal table, respectively, wherein the step of finding comprises indexing into the C_worst table, the C_best table, and the C_nominal table using widths and spacings of the nets as indexes, wherein:
  the worst capacitance is the capacitance between the net and neighboring nets when lithography masks comprising patterns of the net shifts relative to each other;
  the best capacitance is a capacitance between the net and the neighboring nets when the lithography masks comprising the patterns of the net shifts relative to each other;
  the nominal capacitance is a capacitance between the net and the neighboring nets when the lithography masks comprising the patterns of the net do not shift relative to each other;
  the C_worst table stores greatest parasitic capacitances between layout patterns of the integrated circuit when lithography masks comprising the layout patterns shift relative to each other;
  the C_best table stores smallest parasitic capacitances between the layout patterns when the lithography masks shift relative to each other; and
  the C_nominal table stores nominal parasitic capacitances between the layout patterns when the lithography masks do not shift relative to each other;
reading colors of the nets from the layout; and
replacing parasitic capacitance values of portions of the nets that have a same color with nominal capacitances found from the C_nominal table.

12. The method of claim 11 further comprising writing the at least two of the worst capacitance, the best capacitance, and the nominal capacitance into netlists, wherein the worst capacitance, the best capacitance, and the nominal capacitance are associated with the each of the nets, and wherein the netlists are embodied on an additional tangible non-transitory computer-readable medium.

13. The method of claim 12 further comprising:
retrieving the worst capacitance, the best capacitance, and the nominal capacitance from the netlists; and
simulating a worst performance, a best performance, and a nominal performance of the integrated circuit using the worst capacitance, the best capacitance, and the nominal capacitance, respectively.

* * * * *

UNITED STATES PATENT AND TRADEMARK OFFICE
CERTIFICATE OF CORRECTION

| | | |
|---|---|---|
| PATENT NO. | : 8,751,975 B2 | Page 1 of 1 |
| APPLICATION NO. | : 13/479076 | |
| DATED | : June 10, 2014 | |
| INVENTOR(S) | : Su et al. | |

It is certified that error appears in the above-identified patent and that said Letters Patent is hereby corrected as shown below:

In the Claims
Col. 10, line 31, claim 5, delete "form" and insert --from--.
Col. 10, line 32, claim 5, delete "form" and insert --from--.
Col. 10, line 33, claim 5, delete "form" and insert --from--.

Signed and Sealed this
Twenty-sixth Day of August, 2014

Michelle K. Lee
*Deputy Director of the United States Patent and Trademark Office*